(12) United States Patent
Ajmera et al.

(10) Patent No.: US 6,503,833 B1
(45) Date of Patent: Jan. 7, 2003

(54) SELF-ALIGNED SILICIDE (SALICIDE) PROCESS FOR STRAINED SILICON MOSFET ON SIGE AND STRUCTURE FORMED THEREBY

(75) Inventors: Atul Champaklal Ajmera, Wappingers Falls, NY (US); Cyril Cabral, Jr., Ossining, NY (US); Roy Arthur Carruthers, Stormville, NY (US); Kevin Kok Chan, Staten Island, NY (US); Guy Moshe Cohen, Mohegan Lake, NY (US); Paul Michael Kozlowski, Hopewell Junction, NY (US); Christian Lavoie, Ossining, NY (US); Joseph Scott Newbury, Tarrytown, NY (US); Ronnen Andrew Roy, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 09/712,264

(22) Filed: Nov. 15, 2000

(51) Int. Cl.[7] ............................................. H01L 21/44
(52) U.S. Cl. ....................... 438/682; 438/683; 438/655; 438/656; 438/664
(58) Field of Search .................................. 438/682, 683, 438/664, 655, 656, FOR 356, FOR 360, FOR 362, FOR 196; 257/382, 384, 412–3

(56) References Cited

U.S. PATENT DOCUMENTS 4,218,291 A * 8/1980 Fukuyama et al. .... 204/192.15
5,698,869 A * 12/1997 Yoshimi et al. ............. 257/192
5,773,331 A    6/1998 Solomon et al.
6,323,130 B1 * 11/2001 Brodsky et al. ............. 438/630
2001/0003056 A1 * 6/2001 Hashimoto et al. ......... 438/592

FOREIGN PATENT DOCUMENTS

SU           1389603 A1 * 3/1993 ........... H01L/21/28

OTHER PUBLICATIONS

Kern (Ken) Rim, Judy L. Hoyt, and James F. Gibbons, "Transconductance Enhancement in Deep Submicron Strained–Si n–MOSFETs", IEEE, Sep. 1998, pp. 1–4.

T. Yoshitomi, M. Saito, T. Ohguro, M. Ono, H.S. Momose, and H. Iwai, "Silicided Silicon–Sidewall Source and Drain ($S^4$ D) Structure for High–Performance 75–nm Gate Length pMOSFETs", Symposium on VLSI Technology Digest of Technical Papers, Apr. 1995, pp. 11 and 12.

K. Rim, J. Welser, J.L. Hoyt, and J.F. Gibbons, "Enhanced Hole Mobilities in Surface–Channel Strained–Si p–MOSFETs", IEEE, 1995, pp. 1–4.

* cited by examiner

Primary Examiner—Wael Fahmy
Assistant Examiner—Thanh Pham
(74) Attorney, Agent, or Firm—Kevin M. Jordan, Esq.; McGinn & Gibb, PLLC

(57) ABSTRACT

A method of forming a semiconductor substrate (and resultant structure), includes providing a semiconductor substrate to be silicided including a source and drain formed therein on respective sides of a gate, depositing a metal film over the gate, source and drain regions, reacting the metal film with Si at a first predetermined temperature, to form a metal-silicon alloy, etching the unreacted metal, depositing a silicon film over the source drain and gate regions, annealing the substrate at a second predetermined temperature, to form a metal-$Si_2$ alloy, and selectively etching the unreacted Si.

35 Claims, 4 Drawing Sheets

SELF-ALIGNED SILICIDE (SALICIDE) PROCESS FOR STRAINED SILICON MOSFET ON SIGE AND STRUCTURE FORMED THEREBY

U.S. GOVERNMENT RIGHTS IN THE PATENT

The present invention was at least partially funded under Defense Advanced Research Projects Agency (DARPA) Contract No. N66001-97-1-8908, and the U.S. Government has at least some rights under any subsequently-issued patent.

BACKGROUND OF THE INVENTION

1. Field of the Invention

The present invention relates to a strained Si MOSFET, and to a method of forming a low resistivity contact to a strained Si MOSFET.

2. Description of the Related Art

Silicon metal oxide semiconductor field effect transistor (MOSFET) scaling requires the continuous reduction of the gate length, the gate dielectric thickness, and higher substrate doping. These requirements contribute to an increased vertical field in the channel, which lowers the channel inversion layer mobility and current drive, as described in K. Rim et al., "Transconductance Enhancement in Deep Submicron Strained-Si N-MOSFET", IEDM 1998 Tech. Digest, p. 707, 1998.

The channel mobility of both n-MOSFETs and p-MOSFETs is enhanced if the channel is made of "strained silicon". The strained silicon channel is obtained by growing a thin pseudomorphic Si layer (e.g., on the order of 15 nm to 20 nm thick) on a relaxed relatively thick Si(1-x)Ge(x), where x is typically 0.2 to 0.3, as described in the above-mentioned Rim et al. and J. Welser et al., IEDM 1994 Tech. Digest, p. 373, 1994.

For purposes of the present invention, "strained-Silicon" means that the silicon film is stretched to accommodate the underlay film lattice constant. For example, if the underlay film has a lattice constant which is larger than that of silicon, the silicon film would be tensely strained. Such straining is performed by forming a relatively thin silicon layer on a substrate, with the silicon layer having a different lattice constant from that of the substrate. However, the upper layer attempts to maintain a same lattice constant as the substrate, and thus is "strained" while attempting to make such an accommodation.

In contrast, "relaxed" in the context of the present application means that the upper layer is formed to be indifferent to the lattice constant of the substrate. Typically, in such a case, the upper layer is relatively thick and thus does not attempt to match the lattices of the substrate.

In practice, the straining of the thin silicon film is achieved by forming the film over a thick $Si_{(1-x)}Ge_{(x)}$ grown on a Si substrate. The SiGe film is made thick enough (typically more than a micron thick for x=0.3) so that the film relaxes to its bulk lattice constant. Given that the thick SiGe layer is relaxed then for the purpose of forming a strained thin Si film on top of it, it may be viewed as a substrate with a different lattice constant than that of silicon.

The enhancement in mobility was found to be as large as 75% for n-MOSFET devices, as described in Rim et al. and 80% for p-MOSFET devices with x=0.2, as described in Rim et al., "Enhanced Hole Mobility in Surface-Channel Strained-Si p-MOSFET", IEDM 1995 Tech. Digest, p. 517, 1995. The typical thickness of the strained Si film is approximately 13 nm. An attempt to grow a substantially thicker film tends to cause the layer to relax. It is noted that the thickness of the strained silicon layer will depend on the composition of the underlying buffer layer. Thus, assuming SiGe was used for the buffer layer, using a composition having 40% Germanium would result in a thinner upper silicon layer, whereas using a composition having 30% Germanium would result in a thicker upper silicon layer.

High speed devices require the use of silicide for the source and drain to reduce the parasitic series resistance. However, applying the conventional self-aligned silicide (salicide) process to the strained-Si MOSFET is not straight-forward due to several issues and consequently has some drawbacks.

For example, the strained Si film is too thin to accommodate the conventional silicide. For example, if cobalt (Co) is used to make the silicide, then the Si film must be thicker than about 25 nm to accommodate the silicide ($CoSi_2$). However, the pseudomorphic Si layer cannot be made thicker than approximately 15 nm (e.g., a critical thickness, which is the maximum thickness which can be grown for the strained layer until it begins to relax; as mentioned above, the critical thickness depends upon the composition of the substrate such as the percentage of germanium, etc.) or otherwise it relaxes, as mentioned above.

Secondly, since the strained Si film is not thick enough to supply enough Si to form the silicide, the silicide would have to consume some of the underlying SiGe buffer. However, the formation temperature of the silicide in SiGe is higher than in Si, as shown in FIG. 7.

For example, the lowest formation temperature of $CoSi_2$ in a single crystal $Si_{0.7}Ge_{0.3}$ is about 825° C., as compared with 625 ° C. in pure Si. The higher formation temperature has serious implications such as dopant diffusion in the source and drain, and relaxation of the pseudomorphic strained Si film.

The conventional approach to the above-mentioned problem is to make the silicon thicker in the source and drain regions prior to applying the salicide process. The addition of silicon must be selective, and must be limited only to the source and drain regions (and then to the gate) or otherwise bridging will occur.

On the other hand, if the continuous film of silicon is deposited, the gate and the drain (and source) become connected when the silicide is formed. Thus, to avoid shorting of the gate to the source and drain, a selective deposition must be used. Selective epitaxy is usually the preferred method to add silicon only to the source, drain and gate regions. The silicon epitaxially grows only where a silicon seed exists. Thus, silicon will be added to the gate, source and drain regions which have a silicon (or poly-Si) surface, but no deposition occurs on dielectric surfaces such as the device source/drain spacers.

Unfortunately, the use of selective epitaxy has serious drawbacks. For example, the epitaxial growth must be truly selective. That is, the selectivity of the growth depends on various variables including the growth temperature, the silicon source, and the dielectric material. Usually, a higher growth temperature yields a more selective growth with less deposition on non-silicon surfaces. The requirement for a high growth temperature may exceed the thermal budget allowed by the conventional salicide process. The best known silicon source for selective epitaxy is $SiCl_4$. Unfortunately, this source requires a high growth temperature, typically 900° C. to 1200° C. However, applying such a high temperature is not possible, since it would lead to the relaxation of the strained Si film, and to dopant diffusion. Silane ($SiH_4$) permits low growth temperatures down to 650° C. Yet, this silicon source is not very selective.

Another problem is process robustness. That is, Si epitaxy is very sensitive to surface preparation and cleaning. Different surface treatments could lead to different defects in the film. Oxide residuals (even an atomic mono layer) could prevent the epitaxial growth.

A third problem is the growth rate dependency on feature size. That is, in chemical vapor deposition (CVD)-type epitaxy, the growth rate may be dependent on the topography, the dimensions of the growth area, and the ratio between the growth to nongrowth areas. This may lead to a growth of different film thicknesses in devices that are embedded in different circuit layouts.

A fourth problem is the relaxation of the Si film in the source/drain region. That is, the thickening of the strained Si film in the source/drain region by epitaxy leads to a strain relaxation of the film. The relaxation typically is achieved by defects that may extend from the source/drain regions into the channel region.

SUMMARY OF THE INVENTION

In view of the foregoing and other problems, disadvantages, and drawbacks of the conventional methods and structures, an object of the present invention is to provide a new self-aligned (salicide) method which is applicable to strained Si MOSFET on, for example, SiGe (Note: for purposes of the present invention, SiGe will be assumed for the buffer layer, but of course other materials can be used as would be known by one of ordinary skill in the art taking the present application as a whole).

Another object is to provide a new method which does not require the use of selective epitaxy for thickening the source and drain. It also uses the same thermal cycles of a conventional bulk MOSFET, and thus at no point is the device exposed to elevated temperatures that may exceed the allowed thermal budget.

In a first aspect, a method of forming a semiconductor substrate, includes providing a semiconductor substrate to be silicided including a source and drain formed therein on respective sides of a gate, depositing a metal film over the gate, source and drain regions, reacting the metal film with Si at a first predetermined temperature, to form a metal-silicon alloy, selectively etching the unreacted metal, depositing a silicon film onto the device, annealing the device at a second predetermined temperature, to form a metal-$Si_2$ alloy, and selectively etching the unreacted Si.

With the unique and unobvious features and aspects of the invention, the problem of forming a silicide in SiGe (or other candidate materials) is overcome by a new self-aligned silicide (salicide) that does not require an increase in the thermal budget applied to the device. Further, the first and second salicide anneal temperatures are the same as in the conventional salicide process of bulk MOSFET, since the silicide (e.g., $CoSi_2$) is meant to form only in the deposited top silicon film. Thus, the invention circumvents high temperature issues such as dopant diffusion, and relaxation of the pseudomorphic strained Si layer. These advantages are achieved without introducing expensive and difficult-to-control processes such as selective epitaxy of the source and drain regions.

BRIEF DESCRIPTION OF THE DRAWINGS

The foregoing and other purposes, aspects and advantages will be better understood from the following detailed description of a preferred embodiment of the invention with reference to the drawings, in which:

FIGS. 1A–6 illustrate processing steps of a method according to a preferred embodiment of the present invention in which:

FIG. 1A illustrates a flowchart of a method 100 according to the preferred embodiment as described in relation to the structure shown in FIGS. 1B–6;

FIG. 2 illustrates depositing a thin film of cobalt onto gate, source and drain regions of the device 10;

FIG. 3 illustrates a first annealing of the device to form an alloy (e.g., CoSi);

FIG. 4 illustrates depositing of an amorphous silicon onto the alloy gate and source and drain regions of the device 10;

FIG. 5 illustrates a second annealing of the device to from an alloy (e.g., $CoSi_2$);

FIG. 6 illustrates a selective etching of the unreacted amorphous silicon of the device 10.

DETAILED DESCRIPTION OF PREFERRED EMBODIMENTS OF THE INVENTION

Figure 1B:
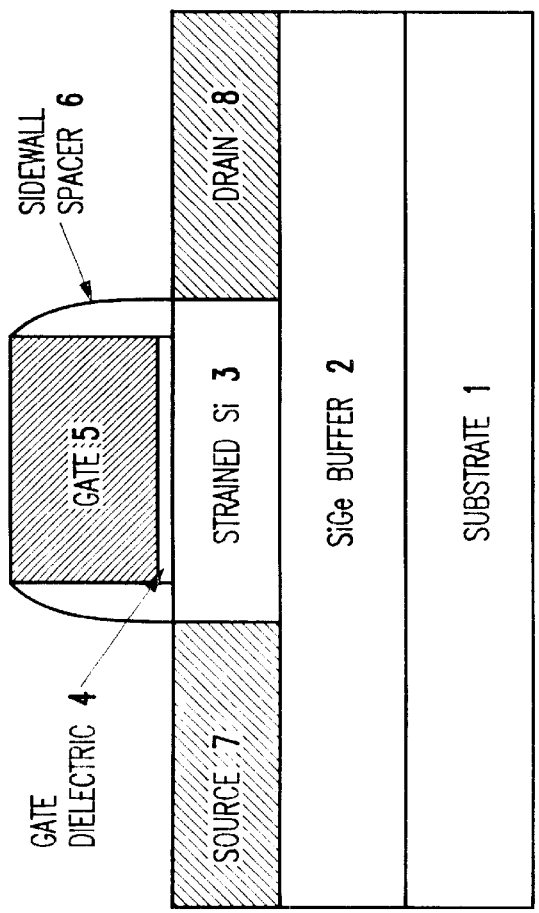
FIG. 1B illustrates a device 10 to be salicided.

Referring now to the drawings, and more particularly to FIGS. 1A–7, there is shown a preferred embodiment of the method and structures according to the present invention.

The process flow is shown in FIGS. 1A to 6. Although the process flow is demonstrated using a conventional MOSFET structure, the method of the present invention is applicable to almost any other, less frequently used, structures as well and such can be considered as a method of forming a substrate. Hereinbelow, the use of Co has been assumed, but other metals useful for suicides such as Ti, Pd, and/or Pt, also can be used with the present invention.

Figure 1A:
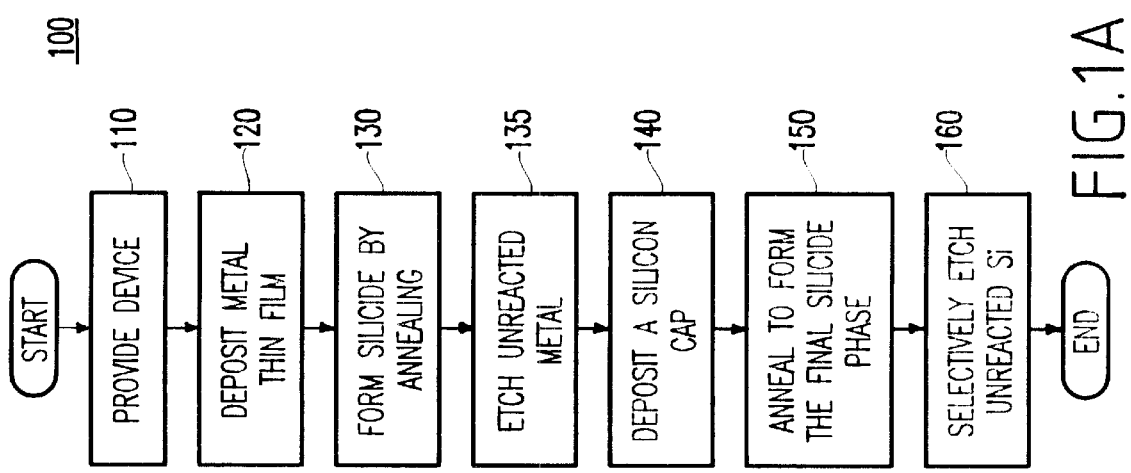

FIG. 1A illustrates a flow diagram of the inventive method 100, whereas FIGS. 1B through FIG. 6 show the structure processed by the inventive method.

FIG. 1B shows the initial device to be silicided (e.g., see step 110 of FIG. 1A). The structure includes a Si substrate 1, a "relaxed" SiGe buffer layer 2, a strained Si film 3, a gate dielectric 4, a patterned gate 5, and two sidewall spacers 6. The source 7 and drain 8 are typically 45 fabricated by introducing dopant into the strained Si film 3 on both sides of the gate. Thus, the source and drain are formed in the layer of strained silicon film 3.

Figure 2:
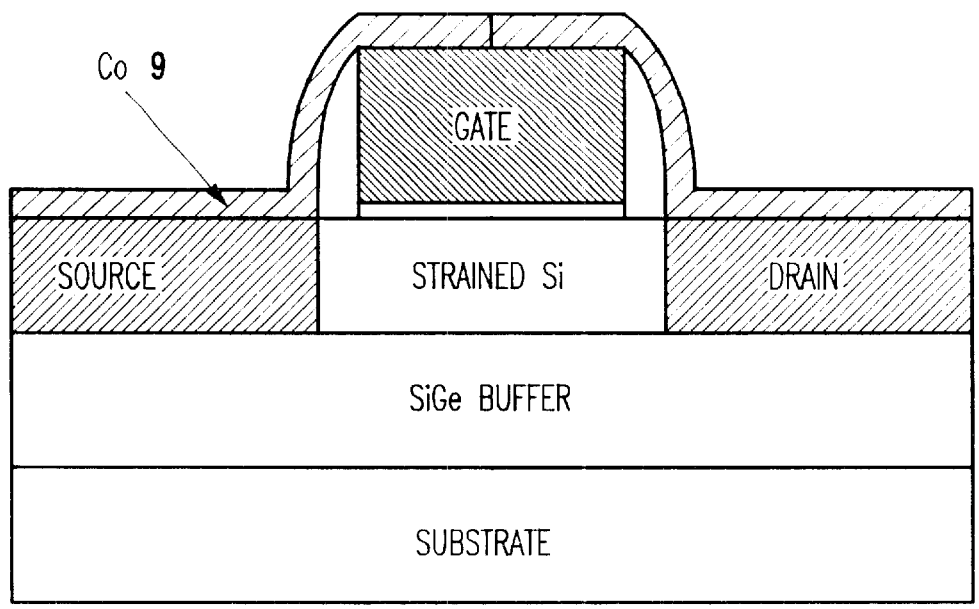

As shown in FIG. 2, a thin film of metal (e.g., Co in the preferred embodiment due to a cobalt disilicide having a low sheet resistance, but, as mentioned above, other metals can be used; in the example described below, Co will be assumed) 9 is deposited over the gate, source and drain regions (e.g., see step 120 of FIG. 1A).

Figure 3:
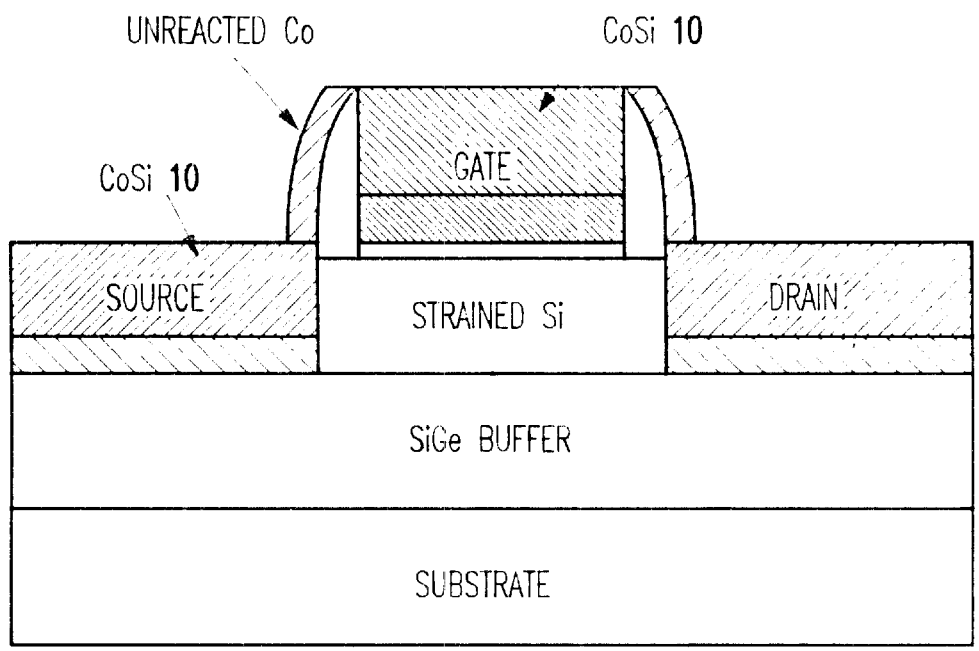

In FIG. 3, the Co is reacted with Si at a low enough temperature, T1, to form the monosilicide phase CoSi 10 (e.g., see step 130 of FIG. 1A). In the case of Co, the temperature window for T1 is about 481° C. to about 625° C. At a temperature lower than 481° C., the CoSi phase may not form, whereas at a temperature higher than 625° C., the $CoSi_2$ phase would start to form. The unreacted Co is removed by selective etching (e.g., 10:1 $H_2O_2$:$H_2SO_4$ at 65° C., see step 135 of FIG. 1A). This step is similar to an etching step in the conventional salicide process. Thus, the first annealing forms the monosilicide. It is noted that, to form the monosilicide, a given amount of silicon is needed (i.e., 1 nm of Co would require 1.82 nm of Si to form the CoSi phase). Hence, if 8 nm of Co is deposited, then at least 14.56 nm of silicon would be required to convert all of the Co into CoSi.

However, as explained below, the process does not stop at the monosilicide but instead wishes to form a disilicide. Hence, another source of silicon is required as shown in FIG. 4.

Figure 4:
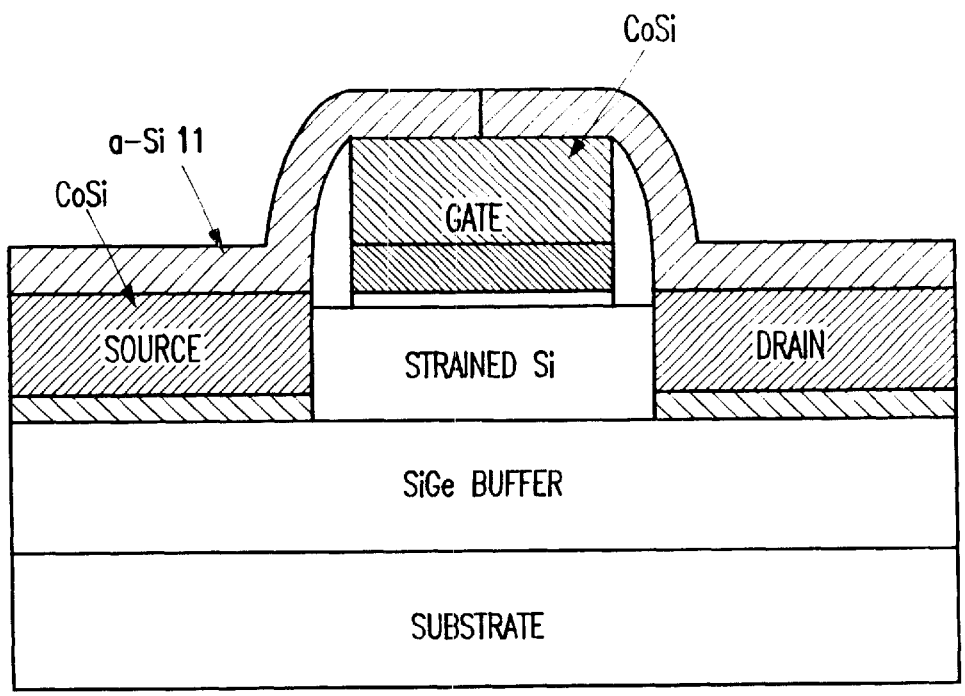

Thus, as shown in FIG. 4, an amorphous Si (a-Si) or a poly-Si film (cap) 11 is deposited (e.g., see step 140 of FIG. 1A). For example, the silicon cap may be deposited by sputtering or evaporation. Preferably, such a film has a thickness of between about 15 nm to about 75 nm.

Figure 5:
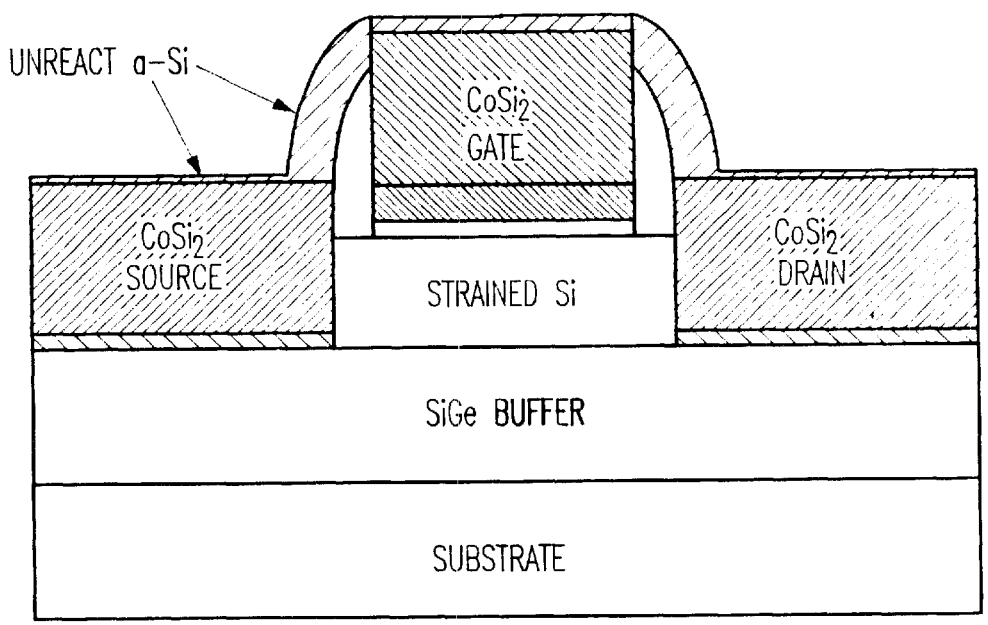

Then, as shown in FIG. 5, the wafer is annealed at a high enough temperature (e.g., T2>T1), to form $CoSi_2$ (e.g., see step 150 of FIG. 1A). Preferably, such a temperature T2 is above 625° C. but within the conventional thermal budget (e.g., less than about 750° C.). The deposition of the a-Si film (or polysilicon) guarantees the supply of Si for the formation of the $CoSi_2$ phase.

Figure 6:
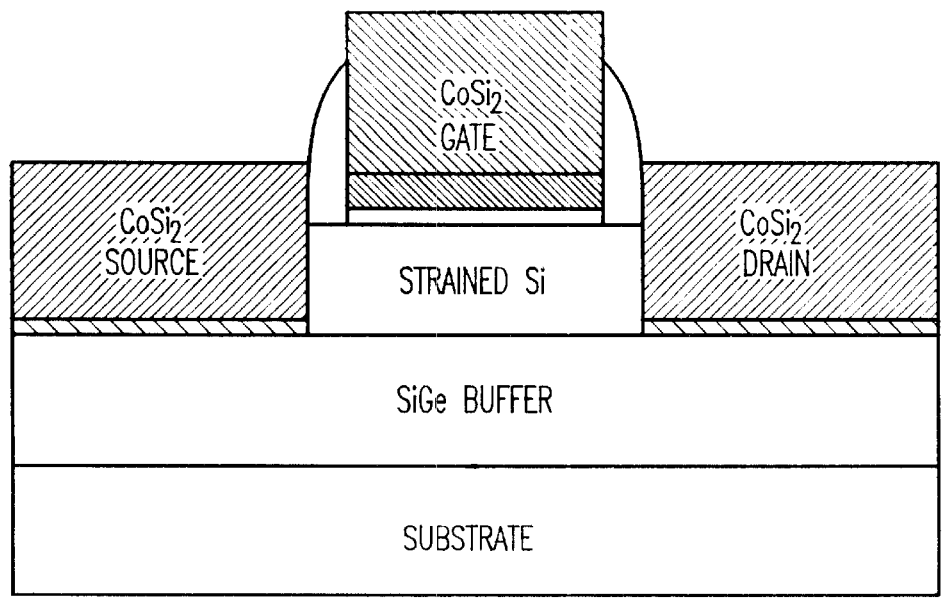

Then, as shown in FIG. 6, the unreacted Si is selectively etched (e.g., see step 160 of FIG. 1A). The etch may be a wet etch or the like using, for example, TMAH, which is very selective.

Figure 7:
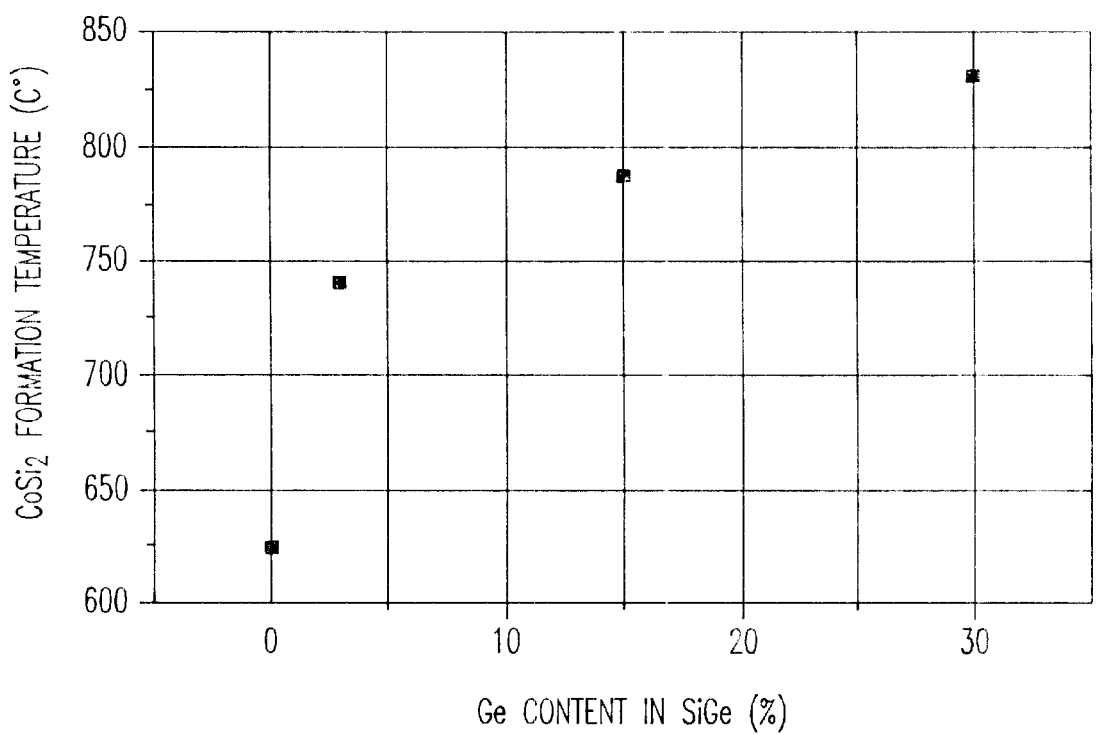
FIG. 7 illustrates a table showing a relationship of $CoSi_2$ formation temperature to Ge content in SiGe.

To form the $CoSi_2$ phase in $Si_{0.7}Ge_{0.3}$, an anneal temperature higher than 825° C. is required, as shown in the graph of FIG. 7. Since the annealing temperature T2 that is typically used for conventional salicide is 750° C., the $CoSi_2$ formation will only occur in the deposited aSi film 11 (or the polysilicon film).

That is, FIG. 7 illustrates the amount of Ge content in the buffer layer as related to the $CoSi_2$ formation temperature. It is noted that the silicon may continue to be consumed such that the source is entirely consumed to reach the silicon-Ge buffer. FIG. 7 illustrates that, if there is no (0%) of Ge in the buffer layer (e.g., pure silicon), then the formation temperature is about 625 C., whereas if a small amount of Ge (3–4% of Ge) is added to the SiGe buffer layer, then the reaction temperature increases dramatically to approximately 740° C. Similarly, if the Ge content in the SiGe is 15%, then the reaction temperature is approximately 790° C. Moreover, if 30% Ge was used, the reaction temperature would be about 825° C. Hence, the invention can optimally tailor the reaction temperatures.

That is, the invention recognizes that the reaction can use the top silicon (e.g., strained silicon layer) depending upon a reaction temperature used. For example, the top silicon will react at 700° C., but the "bottom" silicon (i.e., in the Si—Ge buffer layer) will not react since the addition of the Ge in the Si—Ge layer raises the reaction temperature significantly. Thus, all of the top silicon can be reacted at 700° C., but none of the Si in the Si—Ge layer will be reacted since, for example, a 3–4% Ge composition of such a layer would require a reaction temperature of 740° C. Hence, if the designer wishes to form a unique source and drain structure in which the source and drain are higher than the channel, then such a unique structure can be formed.

Thus, with the unique and unobvious aspect of the present invention, the problem of forming a silicide in SiGe (or other candidate materials) is overcome by a new self-aligned silicide (salicide) process that does not require an increase in the thermal budget applied to the device.

Moreover, the first and second salicide anneal temperatures are the same as in the conventional salicide process of bulk MOSFET, since the silicide (e.g., $CoSi_2$) is meant to form only in the deposited top silicon film. Thus, the invention circumvents high temperature issues such as dopant diffusion, and relaxation of the pseudomorphic strained Si layer. These advantages are achieved without introducing expensive and difficult-to-control processes such as selective epitaxy of the source and drain regions.

Hence, adding the silicon layer on top is extremely important and advantageous in avoiding having to raise the reaction temperature, thereby keeping within the thermal budget. Further, it is noted that, since elevated temperatures can be avoided, then similarly the problem of the strained silicon layer relaxing as a result of such elevated temperatures can be avoided.

While the invention has been described in terms of several preferred embodiments, those skilled in the art will recognize that the invention can be practiced with modification within the spirit and scope of the appended claims.

For example, the invention is not limited to planar source/drain structures and may be applied to other structures such as a MOSFET with sidewall source and drain contacts, as described in U.S. Pat. No. 5,773,331, to P. Solomon et al. and T. Yoshimoto, et al. "Silicided Silicon-Sidewall Source and Drain Structure for High Performance 75-mn Gate Length pMOSFETs", 1995 Symposium on VLSI Technology, Digest p. 11, both incorporated herein by reference.

Further, it is noted that the invention processing may consume all of the strained silicon, or may leave some as shown in FIG. 6 (e.g., see the very thin stripe of silicon), or may consume a portion of the silicon in the Si—Ge buffer layer. Indeed, a very thin strained silicon layer may be employed in which the Si—Ge buffer layer is very rich with Ge, and then at the monosilicide phase (e.g., FIG. 3) all of the Si may be consumed and even some Si in the Si—Ge buffer. This is not a problem since the monosilicide layer does not have an elevated temperature problem. Hence, the CoSi could extend down into the Si—Ge buffer, in which case there would be no "stripe" of Si in FIG. 6.

Further, in some applications it would be desirable not to form a silicide in the relaxed SiGe buffer. This would require minimizing the Si consumption from the strained Si film already during the first anneal. The strained silicon consumption may be reduced if a mixture of metal and Si is deposited in step 120 of FIG. 1A. The process of using Co alloys was first disclosed in U.S. patent application Ser. No. 09/515,033, by Cyril Carbal et. al, "Method for Self-aligned Formation of Silicide Contacts Using Metal Silicon Alloys for Limited Silicon Consumption and for Reduction of Bridging", having IBM Disclosure No. YOR8-2000-0018, filed on Mar. 6, 2000 and incorporated herein by reference.

Thus, instead of a pure Co deposition (step 120), Co is co-deposited with Si. The use of such a mixture of $Co_{1-y}Si_y$, is limited to about y<0.28, or otherwise bridging from source/drain to gate will occur. The reduction in the Si consumption from the strained silicon film is achieved due to the following reasons.

First, the temperature window in which the metal-rich phase, $Co_2Si$, is formed is broadened to about 100° C. This makes it possible to replace the first anneal (step 130 of FIG. 1A) that forms the mono-silicide phase, CoSi, with an anneal that will form the metal-rich phase, $Co_2Si$. The formation of the metal-rich phase consumes only half of the strained Si that would have been consumed by the monosilicide phase. Now, the cap silicon layer may be deposited over the metal-rich phase (after the etching of the unreacted Co—step 135 of FIG. 1A). Thus, the silicide formation is carried out with a second source of silicon on top of the silicide film almost from the very beginning of the process. This reduces the consumption of Si from the strained Si film.

Secondly, some of the silicon which is required to form the silicide phase is already contained in the deposited mixture, and thus the substrate consumption is reduced.

Having thus described our invention, what we claim as new and desire to secure by Letters Patent is as follows:

1. A method of forming a semiconductor substrate, comprising:
   providing a semiconductor substrate to be silicided including a substrate having a source region and a drain region formed therein on respective sides of a gate;
   forming a metal film over the gate, source and drain regions;
   reacting said metal film with Si at a first predetermined temperature, to form a metal-silicon alloy;
   forming a silicon film onto the metal-silicon alloy;
   annealing the substrate at a second predetermined temperature, to form a metal-$Si_2$ alloy; and
   selectively etching said unreacted Si.

2. The method of claim 1, wherein said metal includes at least one of Co, Ti, Pd, and Pt.

3. The method of claim 1, wherein said film of metal has a thickness of approximately 0.3 nm to approximately 50 nm.

4. The method of claim 1, wherein said metal film is cobalt.

5. The method of claim 4, wherein said predetermined temperature is between about 481° C. to about 625° C.

6. The method of claim 5, further comprising:
   selectively etching any unreacted metal.

7. The method of claim 1, wherein said silicon film comprises one of an amorphous Si (a-Si) and a poly-Si film.

8. The method of claim 1, wherein said silicon film has a thickness of between about 15 nm to about 75 nm.

9. The method of claim 1, wherein said method is devoid of a selective epitaxy of the source and drain regions.

10. The method of claim 1, wherein said substrate is $Si_{0.7}Ge_{0.3}$.

11. The method of claim 10, wherein said second predetermined temperature is higher than approximately 825° C.

12. The method of claim 1, wherein said substrate is $Si_{1-x}Ge_x$, where x is between 0.05 to 0.4.

13. The method of claim 1, wherein said metal-$Si_2$ formation occurs only in the forming of a silicon film onto the methal-silicon alloy.

14. The method of claim 1, wherein the semiconductor substrate further comprises a relaxed SiGe buffer layer, a strained Si film, a gate dielectric, a patterned gate, and first and second sidewall spacers, formed in this order on said substrate.

15. The method of claim 1, wherein said second predetermined temperature is higher than said first predetermined temperature.

16. The method of claim 1, wherein said silicon film comprises a strained silicon, and wherein said first annealing consumes substantially all of the strained silicon.

17. The method of claim 1, wherein said silicon film comprises a strained silicon, and wherein said first annealing consumes a portion of the strained silicon.

18. The method of claim 16, wherein said substrate includes a Si—Ge buffer layer, and wherein said first annealing further consumes a portion of the silicon in the Si—Ge buffer layer.

19. The method of claim 1, wherein said method is self-aligned and is devoid of using any of a patterning and a mask.

20. The method of claim 1, wherein said metal film is co-sputtered with silicon, a percentage of said silicon to said metal film being less than 28%.

21. The method of claim 1, wherein said substrate is a $Si_{1-x}Ge_x$ composition, where 0.05<x<0.5.

22. The method of claim 13, further comprising:
   providing a strained silicon film as said silicon film, and
   wherein, if less than all of the strained silicon film is reacted with the methal film to form metal-Si during the first anneal, then the remaining silicon in the strained silicon film reacts to form the metal-$Si_2$ phase.

23. The method of claim 1, wherein the metal film comprises pure metal.

24. The method of claim 1, wherein the metal film comprises a metal-silicon mixture.

25. The method of claim 24, wherein the first anneal forms a metal-rich phase, and the unreacted metal-silicon mixture is etched.

26. The method of claim 25, further comprising forming a Si cap is deposited over the metal-rich phase and annealed to form the disilicide.

27. The method of claim 1, further comprising:
   after said reacting, etching any unreacted portion of the metal.

28. A method of forming a silicide, including:
   providing a substrate to be silicided including forming a metal-silicon mixture over predetermined regions of said substrate;
   reacting said metal-silicon mixture with Si at a first predetermined temperature, to form a metal-rich phase;
   etching any unreacted portion of the metal-silicon mixture;
   depositing a silicon cap over the metal-rich phase;
   annealing the substrate at a second predetermined temperature, to form a metal-$Si_2$ alloy; and
   selectively etching said unreacted Si.

29. A method of forming a semiconductor substrate, comprising:
   providing a semiconductor substrate to be silicided including a substrate having a source region and a drain region formed therein on respective sides of a gate;
   forming a metal-silicon mixture over the gate, source and drain regions;
   reacting said metal-silicon mixture with Si at a first predetermined temperature, to form a metal-rich phase;
   etching any unreacted portion of the metal-silicon mixture;
   depositing a silicon cap over the metal-rich phase;
   annealing the substrate at a second predetermined temperature, to form a metal-$Si_2$ alloy; and
   selectively etching said unreacted Si.

30. The method of claim 29, wherein said metal-rich phase is $Co_2Si$.

31. A method of siliciding a substrate, comprising:
   providing a substrate to be silicided; forming a metal film over the substrate;
   reacting said metal film with Si at a first predetermined temperature, to form a metal-silicon alloy;
   etching the unreacted metal;
   forming a silicon film over said metal-silicon alloy;
   annealing the substrate at a second predetermined temperature, to form a metal-$Si_2$ alloy; and
   selectively etching said unreacted Si.

32. The method of claim 1, wherein said annealing the substrate at a second predetermined temperature forms said metal-$Si_2$ alloy primarily in the silicon film formed onto said metal-silicon alloy.

33. A method of forming a semiconductor substrate, comprising:

providing a semiconductor substrate incorporating a buried barrier layer;

forming a metal film over the said substrate;

reacting said metal film with Si at a first predetermined temperature, to form a metal-silicon alloy;

etching any unreacted portion of the metal;

forming a silicon film onto the metal-silicon alloy;

annealing the substrate at a second predetermined temperature, to form a metal-$Si_2$ alloy; and selectively etching said unreacted Si.

34. The method of claim 33, wherein said second predetermined temperature for forming a metal-$Si_2$ alloy is higher in barrier layer than in said deposited silicon film.

35. The method of claim 33, wherein said barrier layer is $Si_{0.7}Ge_{0.3}$.

* * * * *